United States Patent [19]

Zdebel

[11] Patent Number: 5,070,031

[45] Date of Patent: Dec. 3, 1991

[54] COMPLEMENTARY SEMICONDUCTOR REGION FABRICATION

[75] Inventor: Peter J. Zdebel, Starnberg, Fed. Rep. of Germany

[73] Assignee: Motorola, Inc., Schaumburg, Ill.

[21] Appl. No.: 627,477

[22] Filed: Dec. 14, 1990

[51] Int. Cl.$^5$ ............................................. H01L 21/22
[52] U.S. Cl. ......................................... 437/33; 437/34; 437/59; 437/156; 148/DIG. 25
[58] Field of Search ................. 437/156, 161, 33, 973; 148/DIG. 25

[56] References Cited

U.S. PATENT DOCUMENTS

| | | | |
|---|---|---|---|
| 4,578,128 | 3/1986 | Mundt et al. | 437/156 |
| 4,951,115 | 8/1990 | Harame et al. | 357/44 |
| 4,994,406 | 2/1991 | Vasquez et al. | 437/67 |
| 4,997,776 | 3/1991 | Harame et al. | 437/33 |

Primary Examiner—Olik Chaudhuri
Assistant Examiner—Long Pham
Attorney, Agent, or Firm—Harry A. Wolin

[57] ABSTRACT

A method of forming oppositely doped semiconductor regions includes providing a first semiconductor layer of a first conductivity type and forming a second semiconductor layer of a second conductivity type on a portion of the first layer. A third semiconductor layer is formed on the second layer and the exposed portions of the first layer. The dopant concentration of the third layer is less than the dopant concentration of the second layer so that dopant of the second conductivity type diffuses from the second layer into the portion of the third layer disposed thereabove.

21 Claims, 1 Drawing Sheet

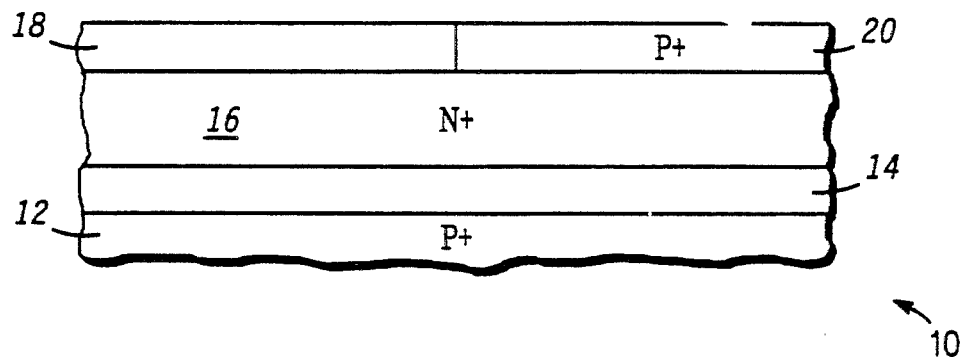
*FIG. 1*
*FIG. 2*
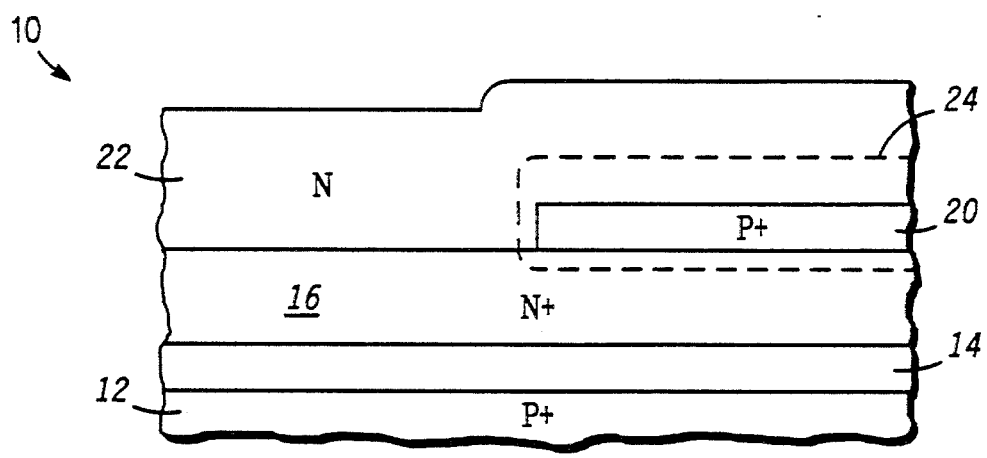
*FIG. 3*
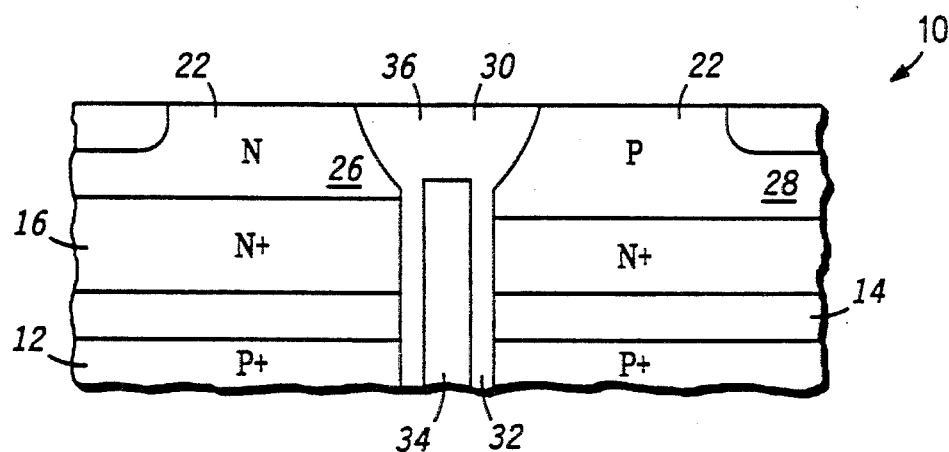

COMPLEMENTARY SEMICONDUCTOR REGION FABRICATION

FIELD OF THE INVENTION

This invention relates, in general, to semiconductor device fabrication and more particularly to a method of fabricating semiconductor regions of opposite conductivity type.

BACKGROUND OF THE INVENTION

A trend in the semiconductor arts is to fabricate integrated circuits incorporating devices of various technologies. An example of this is BICMOS integrated circuits which include bipolar devices, P channel MOS devices and N channel MOS device. To successfully merge these technologies, device structures are required that are compatible to both bipolar and MOS devices. A desirable BICMOS structure should include a buried layer for the BICMOS devices as well as N wells and P wells for the N channel and P channel MOS devices respectively.

One method of fabricating a BICMOS structure includes forming an N+ buried layer and implanting P+ dopant into the buried layer. Following the implantation, an N type epitaxial silicon well layer is grown on the buried layer and the P type dopant diffuses into the well layer to form an N channel therein. This method has been relatively unsuccessful because the P type dopant diffusion is uncontrolled. The dopant will not diffuse only up into the well layer but diffuses in all directions thereby providing an unsatisfactory structure.

Another method of forming P type wells over an N type buried layer includes forming an N type buried layer and growing an epitaxial silicon well layer thereon. Once the well layer has been grown, a screen oxide layer is formed thereon and P type dopant is implanted into the epitaxial silicon well layer. This method is unsatisfactory because it is not feasible to implant the P dopant completely through the well layer to the buried layer. This method again yields devices having poor performance.

In view of the above, it would be highly desirable to have a method of forming oppositely doped wells over a buried layer that would yield high quality semiconductor devices.

SUMMARY OF THE INVENTION

A method of forming semiconductor regions of opposite conductivity types includes providing a first semiconductor layer of a first conductivity type. A second semiconductor layer of a second conductivity type is formed on a portion of the first layer so that another portion of the first layer remains exposed. A third semiconductor layer of the first conductivity type is then formed on the exposed portion of the first layer and on the second layer. The dopant concentration of the third layer is less than the dopant concentration of the second layer so that dopant of the second conductivity type is diffused from the second layer into the portion of the third layer disposed thereabove. This method is useful for forming complementary wells over a buried layer.

BRIEF DESCRIPTION OF THE DRAWINGS

FIGS. 1-2 are highly enlarged cross-sectional views of a semiconductor structure during processing in accordance with the present invention; and FIG. 3 is a highly enlarged cross-sectional view of a semiconductor structure in accordance with the present invention.

DETAILED DESCRIPTION OF THE DRAWINGS

FIGS. 1-2 are highly enlarged cross-sectional views of a semiconductor structure 10 during processing in accordance with the present invention. Structure 10 includes a substrate 12. Substrate 12 comprises monocrystalline silicon, has a P+ conductivity type and a dopant concentration on the order of $2 \times 10^{18}$ atoms cm$^3$. An intermediate layer 14 is formed on substrate 12. Intermediate layer 14 comprises epitaxial silicon and may be either P type or N type. Intermediate layer 14 is relatively low doped having a dopant concentration on the order of $1 \times 10^{14}$ atoms cm$^3$. A buried layer 16 is formed on intermediate layer 14. As depicted herein, buried layer 16 comprises epitaxial silicon and has an N+ conductivity type. Buried layer 16 is doped with arsenic although other dopants may be employed and has a dopant concentration on the order of $4 \times 10^{19}$ atoms cm$^3$.

A dielectric layer 18 is formed over the entire surface of buried layer 16. Dielectric layer 18 includes a screen oxide layer having a thickness on the order of 200 angstroms formed directly on buried layer 16. The screen oxide layer is formed by thermally oxidizing a portion of buried layer 16. Dielectric layer 18 further includes an oxide layer having a thickness on the order of 2000 angstroms that is deposited on the screen oxide layer. This deposited oxide may be formed by PECVD.

Following the formation of dielectric layer 18, an opening is etched therethrough. The opening extends entirely through dielectric layer 18 to the surface of buried layer 16. The opening is formed by first patterning a photoresist mask and then reactive ion etching the desired portions of dielectric 18 to expose buried layer 16.

Once the opening has been formed, semiconductor material 20 is formed therein. In this embodiment, semiconductor material 20 comprises epitaxial silicon and is selectively grown on buried layer 16 in the opening by methods well known in the art. Semiconductor material 20 is of a P+ conductivity type and has a dopant concentration greater than $1 \times 10^{18}$ atoms/cm$^3$. A P type dopant such as boron is employed to dope semiconductor material 20. Semiconductor material 20 may be doped in situ or may be implanted. It should be understood that if semiconductor material 20 is to be implanted, a screen oxide layer is formed thereon prior to implantation. Approximately one-half the thickness of semiconductor material 20 should be implanted and followed by an anneal to drive the implanted dopant throughout the remainder of semiconductor material 20. If semiconductor material 20 is in situ doped, it should be doped in its entirety. Following the formation and doping of semiconductor material 20, the remainder of dielectric layer 18 is removed from the surface of buried layer 16. This can be done with a wet chemical etch.

Now referring specifically to FIG. 2. Once dielectric layer 18 has been removed, an epitaxial layer 22 is formed on buried layer 16 and semiconductor material 20. Epitaxial layer 22 comprises epitaxial silicon herein and may be formed by methods well known in the art. Epitaxial silicon 22 is N type arsenic doped and has a dopant concentration on the order of $5 \times 10^{15}$ to $2 \times 10^{16}$ atoms cm$^3$.

During the deposition of epitaxial layer 22, P type boron is diffused from highly doped semiconductor material 20 (which serves as a diffusion source) into the lower doped surrounding regions of epitaxial layer 22. Additionally, N type dopant is diffused from buried layer 16 into the portions of epitaxial layer 22 not sealed off by semiconductor material 20. Semiconductor material 20 basically seals off the portions of epitaxial layer 22 disposed thereabove from N type diffusion from buried layer 16. The upward diffusion of N type dopant into the portions of epitaxial layer 22 not disposed above semiconductor material 20 also prevents P type diffusion from semiconductor material 20 into these portions. Basically, P type dopant from semiconductor material 20 and N type dopant from buried layer 16 diffuse mainly upward into epitaxial layer 22.

A relatively small amount of P type dopant diffuses downward into buried layer 16 from semiconductor material 20 while a small amount of N type dopant also diffuses upward from buried layer 16 into semiconductor material 20. However, electrical field phenomena generally retards diffusion between N type buried layer 16 and P type semiconductor material 20. It should be understood that diffusion between these regions is not completely eliminated but is greatly diminished. The diffusion of P type dopant from semiconductor material 20 during epitaxial layer 22 deposition is represented by dotted lines 24.

The diffusion of P type dopant from semiconductor material 20 creates a retrograded dopant profile. The P type dopant concentration of the epitaxial material of semiconductor material 20 and epitaxial layer 22 will be highest near buried layer 16 and will decrease as it approaches the top surface of epitaxial layer 22. The retrograded P profile may be made more uniform throughout semiconductor material 20 and epitaxial material 24 by introducing the layers to heat by way of additional thermal cycles. This enables the doping profile to be tailored to specific needs.

A more continuous P dopant profile may also be obtained by implanting additional P dopant into epitaxial layer 22 following its deposition. This also enables tailoring to specific needs. For example, it is desirable to have the surface concentration of a P doped well higher than the approximate mid-point but not as high as the portion abutting the buried layer. This dopant profile causes the space charge region to extend into the lower doped portion of the epitaxial well and not approach its surface. This controls punch through.

An alternative embodiment includes doping semiconductor material 20 with an N type dopant such as phosphorous so that it comprises an N+ conductivity type. Epitaxial layer 22 is then formed and has a P conductivity type. The dopant concentration of epitaxial layer 22 is less than the dopant concentration of semiconductor material 20 so that N type dopant will diffuse into epitaxial layer 22 during its formation. It should be understood that virtually all of the same processes and variations described above with regards to the embodiment including P+ type semiconductor material 20 and N type epitaxial material 22 may be employed with the alternative embodiment just described. Of course, the differences in conductivity type must be considered.

FIG. 3 is a highly enlarged cross-sectional view of semiconductor structure 10 in accordance with the present invention. Once epitaxial layer 22 has been formed and its various regions are doped as disclosed above, a well structure or the like may be formed. An N well 26 and a P well 28 are shown in structure 10 and are isolated from each other by a filled isolation trench 30. Isolation trench 30 includes a trench liner comprising a dielectric and is filled with polysilicon 34. Isolation trench 30 is capped by cap 36 which comprises a dielectric such as an oxide. Isolation trench 30 may be fabricated in accordance with U.S. patent application Ser. No. 07/431,420 entitled "Method of Fabricating Semiconductor Devices Having Deep and Shallow Isolation Structures" filed by B. Vasquez and P. Zdebel on Nov. 3, 1989. This patent application has now been allowed and is awaiting issue. Although the present invention is depicted in a CMOS well structure herein, it should be understood that this is merely exemplary and that the present invention may be employed in various other embodiments.

Thus is is apparent that there has been provided, in accordance with the invention a method of forming complementary semiconductor regions. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of forming semiconductor regions of opposite conductivity type comprising the steps of:
   providing a first semiconductor layer of a first conductivity type;
   forming a second semiconductor layer of a second conductivity type on a first portion of said first layer so that a second portion of said first layer remains exposed; and
   forming a third semiconductor layer of the first conductivity type on said second layer and said exposed second portion of said first layer, the dopant concentration of said third layer being less than the dopant concentration of said second layer so that dopant of the second conductivity type diffuses from said second layer into the portion of said third layer disposed thereabove.

2. The method of claim 1 wherein additional dopant is diffused from the second layer into the portion of the third layer disposed thereabove by heating said layers.

3. The method of claim 1 wherein dopant of the second conductivity type is implanted into the portion of the third layer formed above the second layer.

4. The method of claim 1 wherein a dielectric layer is formed on the first layer, an opening is formed through said dielectric layer and extends to said first layer, the second layer is formed on said first layer in said opening and said dielectric layer is completely removed following the formation of said second layer.

5. The method of claim 4 wherein the second layer is in situ doped or implanted.

6. The method of claim 5 wherein the first layer is employed as a buried layer and the oppositely doped portions of the third layer are employed as wells.

7. A method of forming oppositely doped wells over a buried layer comprising the steps of:

provided a substrate having a buried layer of a first conductivity type thereon;

forming a dielectric layer on said buried layer;

forming an opening in said dielectric layer, said opening extending to said buried layer;

forming a diffusion source layer in said opening, said diffusion source layer being of a second conductivity type;

removing said dielectric layer; and forming a well layer on said buried layer and said diffusion source layer, said well layer being of the first conductivity type and having a dopant concentration less than the dopant concentration of said diffusion source layer so that dopant of the second conductivity type diffuses from said diffusion source layer into the portion of said well layer disposed thereabove.

8. The method of claim 7 wherein additional dopant is diffused from the diffusion source layer into the portion of the well layer disposed thereabove by heating said layers.

9. The method of claim 7 wherein dopant of the second conductivity type is implanted into the portion of the well layer disposed above the diffusion source layer.

10. The method of claim 7 wherein the diffusion source layer is formed by selective epitaxial growth.

11. The method of claim 10 wherein the diffusion source layer is in situ doped or implanted.

12. The method of claim 7 wherein the buried layer, the diffusion source layer and the well layer comprise epitaxial silicon.

13. A method of forming oppositely doped wells over a buried layer comprising the steps of:

providing a substrate having a buried layer of a first conductivity type thereon;

forming a dielectric layer on said buried layer;

forming an opening in said dielectric layer, said opening extending to said buried layer;

forming a diffusion source layer in said opening, said diffusion source layer being of the first conductivity type;

removing said dielectric layer; and forming a well layer on said buried layer and said diffusion source layer, said well layer being of a second conductivity type and having a dopant concentration less than the dopant concentration of said diffusion source layer so that dopant of the first conductivity type diffuses from said diffusion source layer into the portion of said well layer disposed thereabove.

14. The method of claim 13 wherein additional dopant is diffused from the diffusion source layer into the portion of the well layer disposed thereabove by heating said layers.

15. The method of claim 13 wherein dopant of the first conductivity type is implanted into the portion of the well layer disposed above the diffusion source layer.

16. The method of claim 13 wherein the diffusion source layer is formed by selective epitaxial growth.

17. The method of claim 16 wherein the diffusion source layer is in situ doped or implanted.

18. The method of claim 13 wherein the buried layer, the diffusion source layer and the well layer comprise epitaxial silicon.

19. A method of forming a BICMOS structure having oppositely doped wells over a buried layer comprising the steps of:

providing a substrate having an N+ epitaxial silicon buried layer disposed thereon;

forming an oxide layer on said buried layer;

forming an opening in said oxide layer that extends to said buried layer;

selectively growing an epitaxial silicon diffusion source layer on said buried layer in said opening, said diffusion source layer having a P+ conductivity type and being in situ doped or implanted;

removing said oxide layer; and forming an N type epitaxial silicon well layer on said buried layer and said diffusion source layer, said well layer having a dopant concentration less that the dopant concentration of said diffusion source layer so that P type dopant diffuses from said diffusion source layer into the portion of said well layer disposed thereabove.

20. The method of claim 19 wherein additional dopant is diffused from the diffusion source layer into the portion of the well layer disposed thereabove by heating said layers.

21. The method of claim 19 wherein P type dopant is implanted into the portion of the well layer disposed above the diffusion source layer.

* * * * *